United States Patent [19]

Ogawa

[11] Patent Number: 5,426,067

[45] Date of Patent: Jun. 20, 1995

[54] METHOD FOR MANUFACTURING SEMICONDUCTOR DEVICE WITH REDUCED JUNCTION CAPACITANCE

[75] Inventor: Chihiro Ogawa, Tokyo, Japan

[73] Assignee: NEC Corporation, Tokyo, Japan

[21] Appl. No.: 291,998

[22] Filed: Aug. 18, 1994

[30] Foreign Application Priority Data

Aug. 28, 1993 [JP] Japan .................. 5-235379

[51] Int. Cl.⁶ ........................... H01L 21/76
[52] U.S. Cl. ...................... 437/67; 437/69; 437/72; 148/DIG. 50
[58] Field of Search ............ 437/67, 69, 72; 148/DIG. 50

[56] References Cited

U.S. PATENT DOCUMENTS

| | | | |
|---|---|---|---|
| 4,546,538 | 10/1985 | Suzuki | 437/67 |
| 5,004,703 | 4/1991 | Zdebel et al. | 437/72 |
| 5,229,315 | 7/1993 | Jun et al. | 437/72 |
| 5,254,218 | 10/1993 | Roberts et al. | 437/67 |
| 5,256,592 | 10/1993 | Matsushita | 437/67 |
| 5,308,784 | 5/1994 | Kim et al. | 437/69 |

FOREIGN PATENT DOCUMENTS

59-56741 4/1984 Japan .
0219938 12/1984 Japan .................. 437/67

*Primary Examiner*—Brian E. Hearn
*Assistant Examiner*—Trung Dang
*Attorney, Agent, or Firm*—Burns, Doane, Swecker & Mathis

[57] ABSTRACT

A method for manufacturing a semiconductor device in which an opening is formed in an insulation film laid on a semiconductor substrate, and in which an annular trench that is narrower than a minimum width obtained by lithography is formed in the semiconductor substrate along the opening in a self-aligned manner. The method includes the steps of: forming a first insulation film on a main surface of a semiconductor substrate; forming an opening in the first insulation film; forming an annular film along the inner sidewall of the opening; forming a second insulation film on the surface of the semiconductor substrate surrounded by the annular film; removing the annular film to cause the semiconductor substrate to be annularly exposed; forming an annular trench by etching the exposed area of the semiconductor substrate; and forming a film layer containing at least a third insulation film over the entire main surface of the semiconductor substrate including the inside of the annular trench.

7 Claims, 13 Drawing Sheets

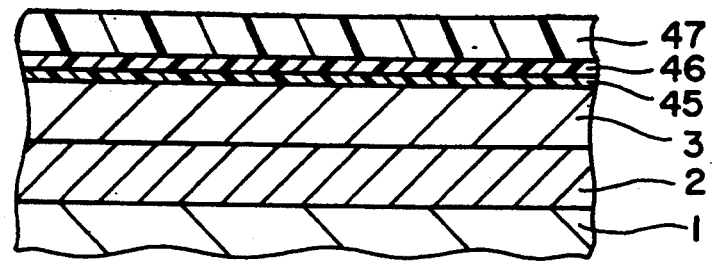
FIG. IA
PRIOR ART
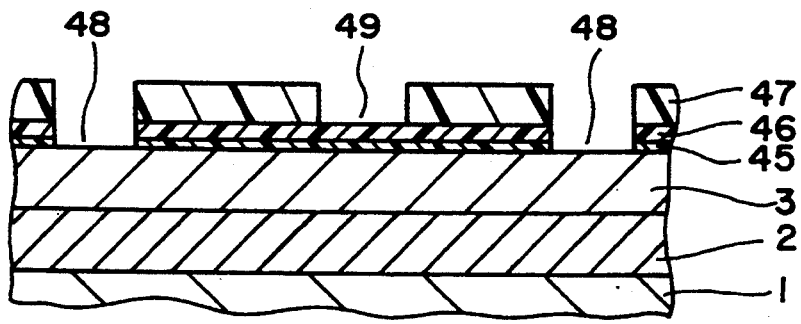
FIG. IB
PRIOR ART
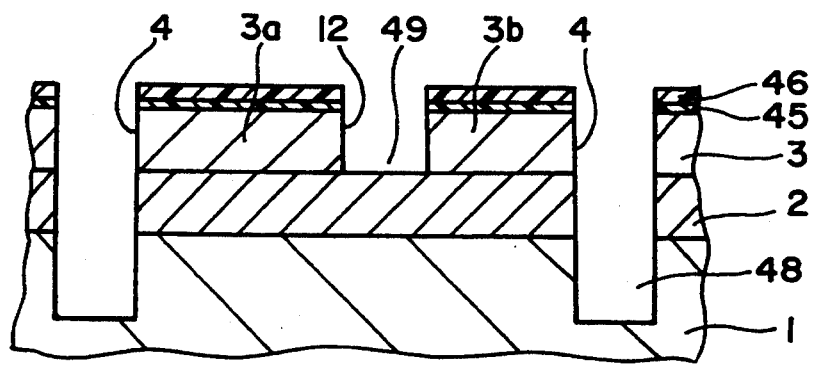
FIG. IC
PRIOR ART
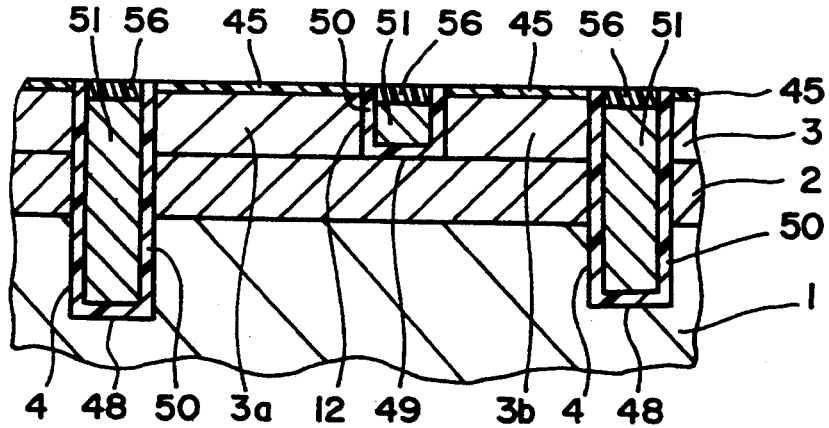
FIG. ID
PRIOR ART

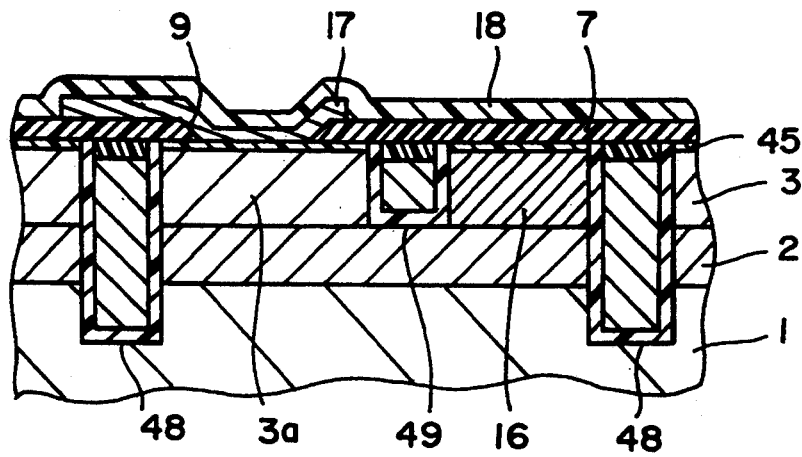
FIG. IE PRIOR ART
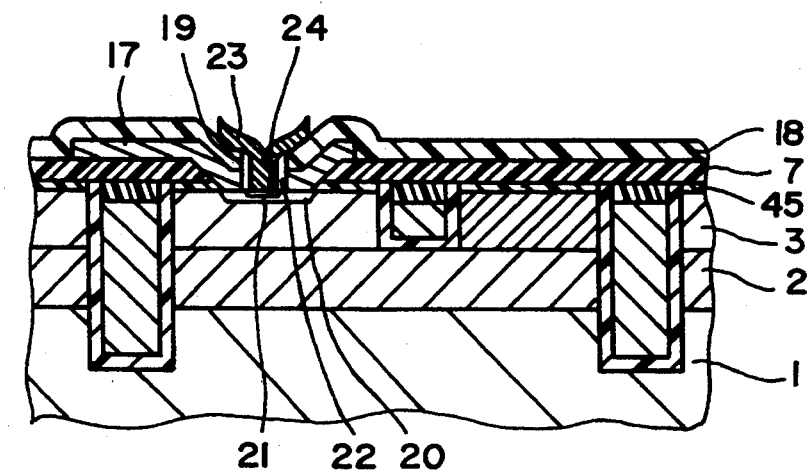
FIG. IF PRIOR ART
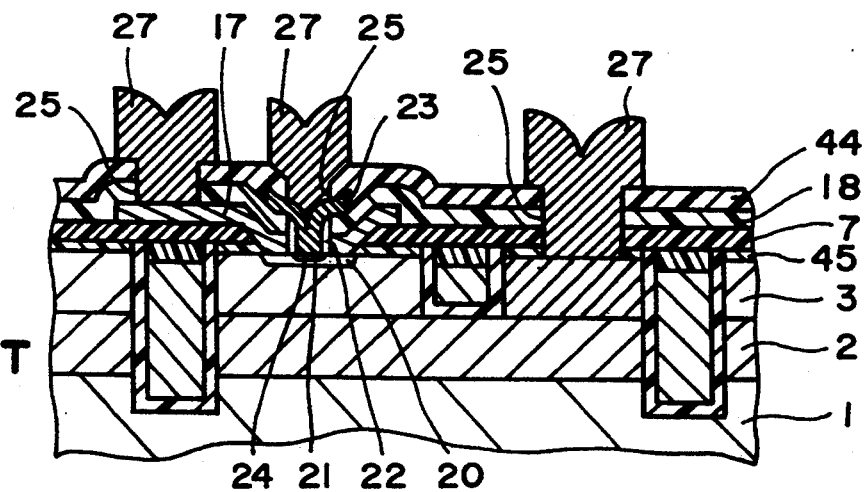
FIG. IG PRIOR ART

METHOD FOR MANUFACTURING SEMICONDUCTOR DEVICE WITH REDUCED JUNCTION CAPACITANCE

BACKGROUND OF THE INVENTION (1) Field of the Invention

This invention relates to a method for manufacturing a semiconductor device, and more particularly to a method for manufacturing a semiconductor device which excels in high speed operation.

(2) Description of the Related Art

For a method for manufacturing a semiconductor device, a technique has been proposed as disclosed, for example, in Japanese Patent Application Kokai Publication No. Sho 59(1984)-56741, in which U-shaped trenches of an inter-semiconductor-element isolation region and a collector isolation region are simultaneously formed. With reference to FIGS. 1A–1G, the conventional semiconductor device manufacturing method will now be described.

FIGS. 1A–1D are cross-sectional views arranged in sequential order of steps A–D of a process for manufacturing a conventional semiconductor device, that is, cross-sectional views arranged in sequential order of steps of the process for obtaining a dielectric isolation structure of the prior art. FIGS. 1E–1G are cross-sectional views arranged in sequential order of steps E–G following the previous steps, that is, cross-sectional views arranged in sequential order of steps E–G of the process for manufacturing a bipolar transistor.

In the conventional semiconductor device manufacturing method, as shown in FIG. 1A, an n-type buried layer 2 having a film thickness of 1.5 μm is first formed on a principal surface of a p-type silicon substrate 1. An n-type epitaxial layer 3 having a thickness of 1.5 μm is then deposited on that n-type buried layer 2. Subsequently, three layers, namely, a silicon dioxide film 45 having a thickness of 0.15 μm, a silicon nitride film 46 having a thickness of 0.35 μm and a PSG (phosphosilicate glass) film 47 having a thickness of 1 μm are stacked in that order on the n-type epitaxial layer 3.

As shown in FIG. 1B, this assembly is then subjected to Reactive Ion Etching (hereinafter referred to as RIE) using a photoresist (not shown in the drawings) as a mask to remove the PSG film 47, the silicon nitride film 46 and the silicon dioxide film 45 located in an element isolation region 48. The assembly is also subjected to RIE using another photoresist (not shown) as a mask to remove only the PSG film 47 located in a collector isolation region 49.

As shown in FIG. 1C, the assembly is subjected to RIE using carbon tetrachloride and boron trichloride, so that a first trench 4, whose bottom surface reaches the inside of the p-type silicon substrate 1, is formed at the element isolation region 48.

At this time, the silicon nitride film 46 and the silicon dioxide film 45 remaining in the collector isolation region 49 cause the etching of that isolation region to be delayed, and hence a second trench 12, which is shallower than the first trench 4, is formed on the n-type buried layer 2 (see step C shown in FIG. 1C).

The thickness of the silicon nitride film 46 and that of the silicon dioxide film 45 are adjusted to such an extent that the bottom of the second trench 12 reaches an upper surface of the n-type buried layer 2.

The n-type epitaxial layer 3 is separated into two regions 3a and 3b through the foregoing steps A–C.

Thereafter, the PSG film 47 is removed, and the resulting cross-section of the assembly in this state is as shown in FIG. 1C.

As shown in FIG. 1D, the assembly is subjected to a thermal oxidation treatment, and a silicon dioxide film 50 is formed along the inner surfaces of the first and second trenches 4 and 12. Subsequently, polysilicon 51 is deposited to fill the inside of the first and second trenches 4 and 12, and the assembly is then etched back to eliminate the polysilicon other than that portion existing inside the first and second trenches 4 and 12.

The assembly undergoes a thermal oxidation treatment, so that a silicon dioxide film 56 is formed on the surface of the polysilicon 51. The silicon nitride film 46 is then removed. The resulting cross section of the assembly at this time is shown in FIG. 1D.

An isolation structure of the prior art is thus obtained through the foregoing steps A–D.

One example of a conventional method when a bipolar transistor is manufactured by the use of this dielectric isolation structure is shown in FIGS. 1E–1G.

Following the process D shown in FIG. 1D, a high density of n-type impurities are implanted into the region 3b of the n-type epitaxial layer 3 by ion implantation, so that an n+-type collector region 16 is formed as shown in FIG. 1E. A silicon dioxide film 7 is deposited, and the silicon dioxide films 7 and 45 are etched using a photoresist (not shown) as a mask, whereby an opening 9 is formed over the n-type epitaxial layer 3a.

After that, p+ polysilicon containing boron (B) is deposited on the opening 9, and the P+ polysilicon film thus deposited is patterned using a not-illustrated photoresist as a mask. Subsequently, a silicon dioxide film 18 is deposited over the entire assembly. The cross section of the assembly in this state is shown in FIG. 1E.

The silicon dioxide film 18 and the p+ polysilicon film 17 located at the area surrounded by the opening 9 are etched away using a not-illustrated photoresist as a mask, whereby an emitter opening 19 is formed as shown in FIG. 1F.

An intrinsic base region 21 is formed by ion implantation or the like, and an emitter sidewall 22 is formed. Polysilicon containing arsenic (As) is then deposited, and the polysilicon film thus deposited is patterned using a not-illustrated photoresist as a mask, so that an emitter polysilicon 23 is formed.

Subsequently, an emitter region 24 and an external base region 20 are formed by a heat treatment. The cross section of the assembly at this time is shown in FIG. 1F.

As shown in FIG. 1G, after a silicon dioxide film 44 has been deposited, a wiring contact hole 25 is formed using a not-illustrated photoresist as a mask.

Aluminum is then deposited and patterned using a not-illustrated photoresist as a mask, so that an aluminum wiring 27 is formed. The cross-section of the assembly at this time is shown in FIG. 1G.

The bipolar transistor is completed through the above explained steps E–G shown in FIGS. 1E–1G.

FIG. 2 is a plan view showing a conventional bipolar transistor thus obtained. A cross-sectional view taken along a line 1G–1G shown in FIG. 2 corresponds to that shown in FIG. 1G. Reference numerals used in FIG. 2 are identical with those used in the aforesaid steps A–G. In FIG. 2, numeral 4a denotes an outer periphery of the first trench 4 while 4b denotes an inner periphery of the same.

According to the conventional semiconductor device manufacturing method set forth in the above, it should be noted that different photoresist masks are used for the formation of the first trench 4 and the second trench 12 (see FIGS. 1B and 1C), respectively. A further photoresist mask is also used in forming the opening 9 (see FIG. 1E).

Thus, where different photoresist masks are used in this way, it is necessary to align the photoresist masks. However, such a positional alignment usually involves an error of approximately 0.2 $\mu$m.

In the foregoing semiconductor device manufacturing method, there are errors of about 0.2 $\mu$m between the patterns for the first trench 4 and the second trench 12 and also between the patterns for the first trench 4 and the opening 9. There is a maximum error of 0.4 $\mu$m between the second trench 12 and the opening 9.

These errors lead to the undesirable situation where the opening 9 will be formed on either the first trench 4 or the second trench 12, and insulation failure will occur, thereby leading to defectives.

To cope with such an alignment error, that is, defective semiconductor devices caused by insulation failure, it is necessary to assure an allowance for alignment between patterns in a conventional semiconductor device.

In such a conventional semiconductor device, because of the necessity of such an allowance, it is impossible to reduce a space to less than 0.4 $\mu$m between the first trench 4 and the opening 9. As a result of this, a junction capacitance between the external base region 20 and the n-type epitaxial layer 3 also occurs along the outer periphery of the external base region 20. Even when the external base region 20 was finely miniaturized, it failed to reduce a parasitic capacitance between a base and a collector.

SUMMARY OF THE INVENTION

In view of the foregoing observations, the primary object of the present invention is to provide a method for manufacturing a semiconductor device in which a parasitic capacitance of an external base region is considerably reduced and the operation speed of the device is increased.

Another object of the present invention is to provide a method for manufacturing a semiconductor device which enables each trench to be extremely minutely formed and which can lead to a small element and a reduced parasitic capacitance.

According to one aspect of the invention, there is provided a method for manufacturing a semiconductor device comprising the steps of:

forming a first insulation film on a main surface of a semiconductor substrate;

forming a first opening in the first insulation film by etching the first insulation film using a photoresist as a mask;

forming a first annular film along an inner sidewall of the first opening with an upper surface of the semiconductor substrate exposed therein;

forming a second film on the exposed surface of the semiconductor substrate surrounded by the first annular film;

etching away the first annular film to cause the surface of the semiconductor substrate to be exposed annularly;

etching an annularly exposed portion of the semiconductor substrate using the photoresist as a mask, to form an annular trench; and forming a film layer containing at least a second insulation film over the entire main surface of the semiconductor substrate including the inside of the annular trench.

BRIEF DESCRIPTION OF THE DRAWINGS

The above and other objects, features and advantages of the present invention will be apparent from the following description of preferred embodiments of the invention explained with reference to the accompanying drawings, in which:

FIGS. 1A-1D are cross-sectional views arranged in sequential order of steps A-D of a process for manufacturing a conventional semiconductor device, that is, a dielectric isolation structure of the prior art;

FIGS. 1E-1G show subsequent steps E-G after the above steps A-D, for manufacturing a conventional bipolar transistor;

FIGS. 3A and 3B illustrate a semiconductor device according to a first embodiment of the present invention, wherein FIG. 3A is a plan view showing the semiconductor device and FIG. 3B is a cross-sectional view taken along a line 3B—3B shown in FIG. 3A;

FIGS. 4A and 4B illustrate a semiconductor device according to a second embodiment of the present invention, wherein FIG. 4A is a plan view showing the semiconductor device and FIG. 4B is a cross-sectional view taken along a line 4B—4B shown in FIG. 4A;

FIGS. 6A and 6B illustrate an effect of the semiconductor device of the present invention, in which FIG. 6A is a plan view showing the semiconductor device and FIG. 6B is a cross-sectional view taken along a line 6B—6B shown in FIG. 6A;

FIGS. 7A and 7B illustrate a conventional semiconductor device corresponding to FIGS. 6A and 6B, wherein FIG. 7A is a plan view showing the semiconductor device and FIG. 7B is a cross-sectional view taken along a line 7B—7B shown in FIG. 7A;

FIGS. 8A and 8B illustrate a semiconductor device according to a third embodiment of the present invention, wherein FIG. 8A is a plan view of the semiconductor device and FIG. 8B is a cross-sectional view taken along a line 8B—8B shown in FIG. 8A;

FIGS. 9A and 9B illustrate a semiconductor device according to a fourth embodiment of the present invention, wherein FIG. 9A is a plan view of the semiconductor device and FIG. 9B is a cross-sectional view taken along a line 9B—9B shown in FIG. 9A;

FIGS. 10A and 10B illustrate a semiconductor device according to a fifth embodiment of the present invention, wherein FIG. 10A is a plan view of the semiconductor device and FIG. 10B is a cross-sectional view taken along a line 10B—10B shown in FIG. 10A; and FIGS. 11A and 11B illustrate an effect of the semiconductor device according to the fifth embodiment, wherein FIG. 11A shows a parasitic capacitance between points W-Z shown in FIG. 10B and FIG. 11B shows a parasitic capacitance when a semiconductor device is not provided with a second trench.

PREFERRED EMBODIMENTS OF THE INVENTION

Now, preferred embodiments of the present invention will be explained hereunder with reference to the accompanying drawings.

Figure 2:
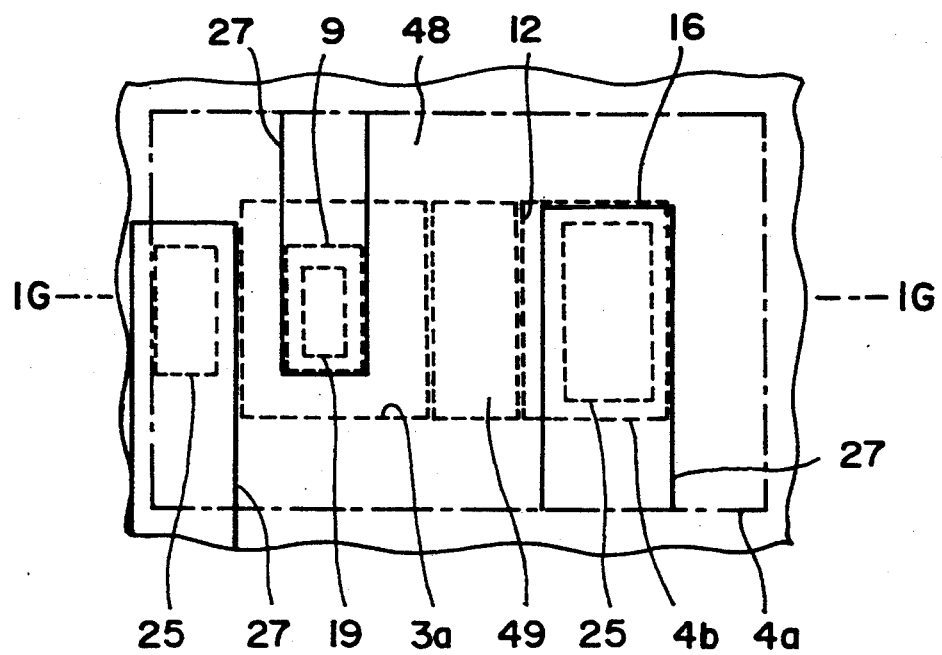
FIG. 2 is a plan view showing the conventional bipolar transistor obtained through the steps E-G shown in FIGS. 1E-1G.
Figure 3A:
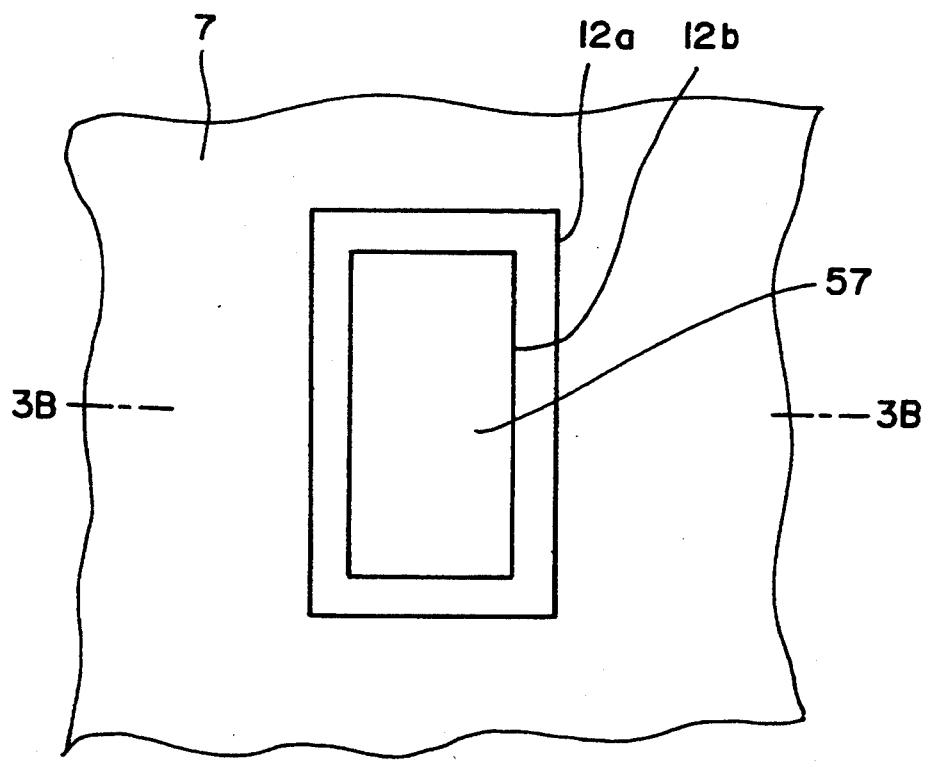
Figure 3B:
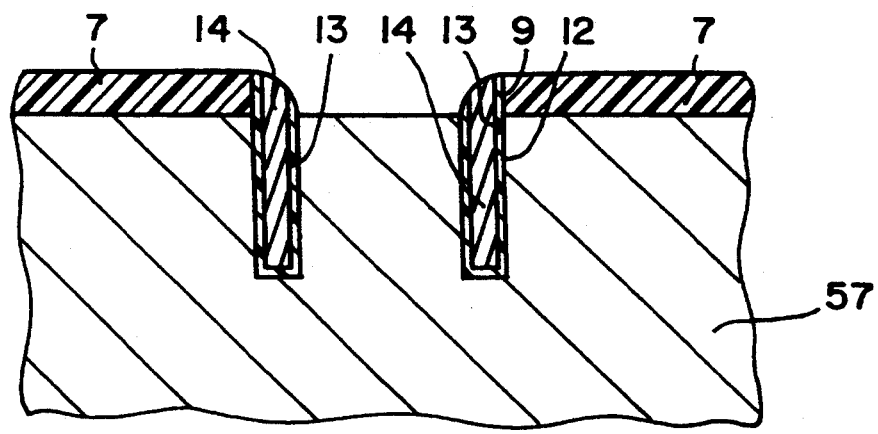

FIGS. 3A and 3B illustrate a semiconductor device according to a first embodiment of the present invention. FIG. 3A is a plan view of the semiconductor device, and FIG. 3B is a cross-sectional view taken along 3B—3B shown in FIG. 3A. In FIG. 3A, reference numeral 12a denotes an outer periphery of the second trench 12, while 12b denotes an inner periphery of the same.

As shown in FIGS. 3A and 3B, particularly FIG. 3B, the semiconductor device of the first embodiment is provided with a silicon layer 57 coated with a silicon dioxide film 7, and an opening 9 is formed in a part of the silicon dioxide film 7.

A second annular trench 12 is formed along the inner side of the opening 9, and the inside of this second trench 12 is filled with a silicon dioxide film 13 and a buried substance 14. A part of the silicon layer 57 surrounded by the second trench 12 is exposed.

In the first embodiment, one kind of insulating material can be used as the buried substance 14 filling inside the second trench 12.

A second embodiment of the present invention is an example in which the insulating and isolation layer structure shown in the first embodiment is applied to a bipolar type device, and this second embodiment will now be described with reference to FIGS. 4A and 4B.

Figure 4A:
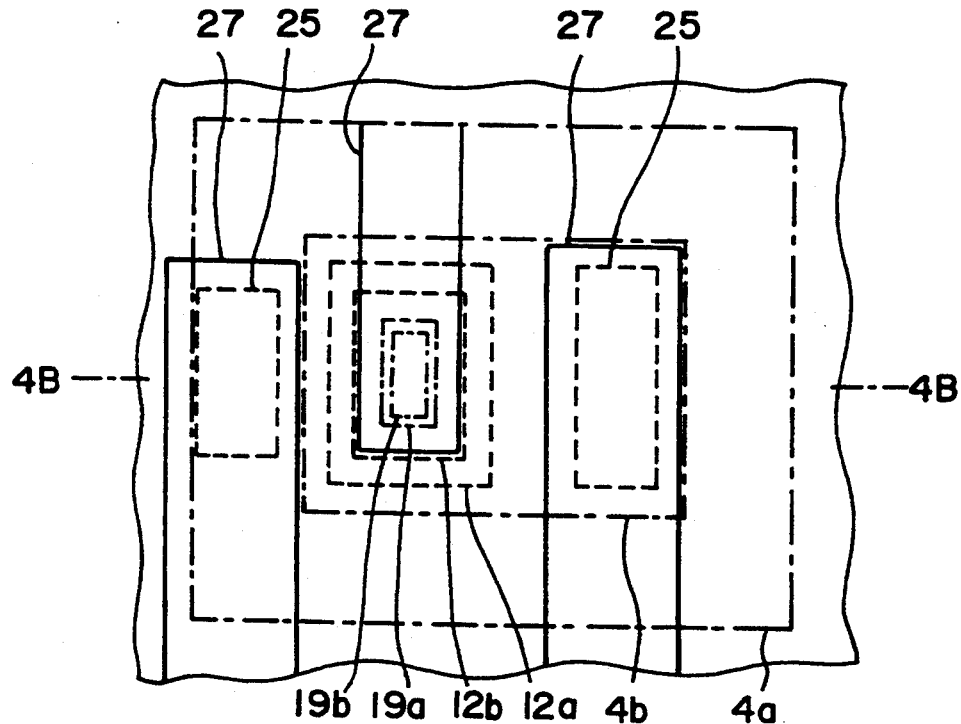
Figure 4B:
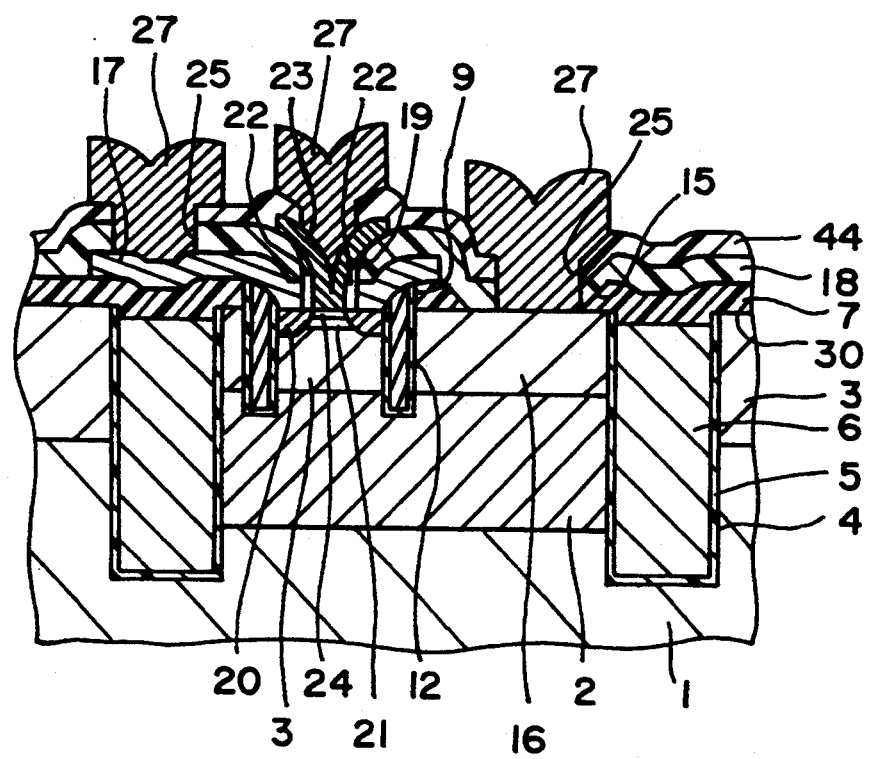

FIGS. 4A and 4B illustrate a semiconductor device according to the second embodiment of the present invention. FIG. 4A is a plan view of the semiconductor device, and FIG. 4B is a cross-sectional view taken along a line 4B—4B shown in FIG. 4A. In FIG. 4A, reference numerals 4a and 4b denote an outer and an inner periphery of the first trench 4, respectively; reference numerals 12a and 12b denote an outer and an inner periphery of the second trench 12, respectively; and reference numerals 19a and 19b denote an outer and an inner periphery of the emitter sidewall 22, respectively.

As shown in FIGS. 4A and 4B, particularly FIG. 4B, an external base region 20 is provided along the second trench 12 of an n-type epitaxial layer 3 (corresponding to the silicon layer 57 of the first embodiment). An intrinsic base region 21 is provided in the vicinity of the surface of the n-type epitaxial layer 3 surrounded by the external base region 20, and an emitter region 24 is provided in the surface region of the n-type epitaxial layer 3 surrounded by the external base region 20.

The external base region 20 is connected to a p+ polysilicon film 17 on the surface thereof, and the emitter region 24 is connected to an emitter polysilicon portion 23 on the surface of the emitter region 24. The p+ polysilicon film 17 and the emitter polysilicon portion 23 are isolated from each other by an emitter sidewall 22.

In FIGS. 4A and 4B, the same reference numerals are provided to designate corresponding elements of FIGS. 5A–5F to be explained later, and hence the explanation thereof will be omitted here for brevity.

Figure 5A:
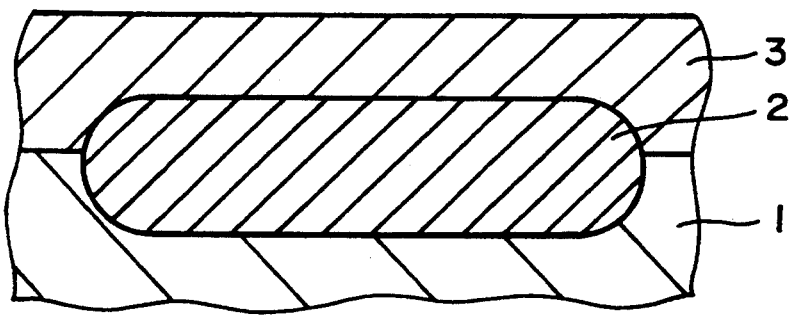
FIGS. 5A-5F are cross-sectional views arranged in sequential order of steps A-F of a process for manufacturing the semiconductor device (a bipolar type device) of the second embodiment.
Figure 5B:
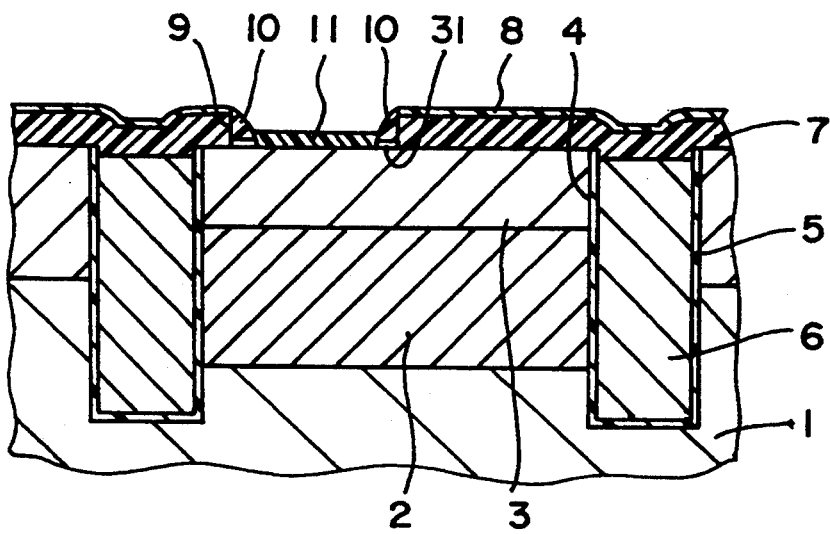
Figure 5C:
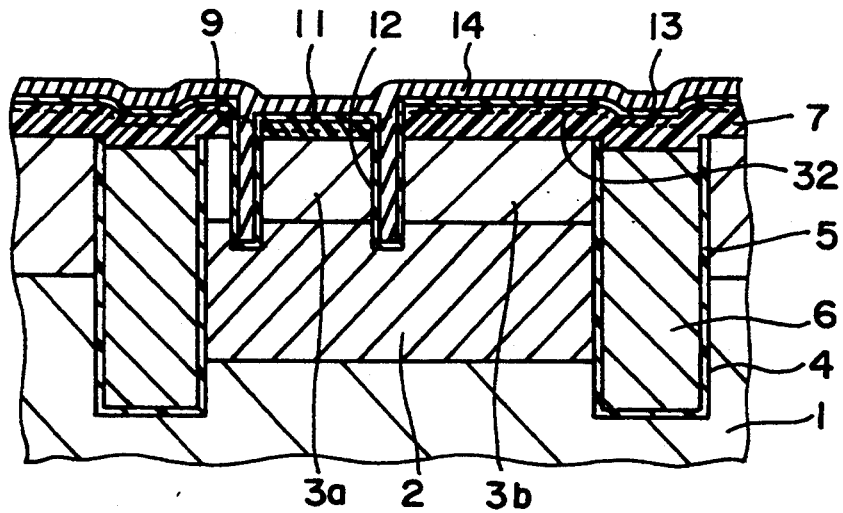
Figure 5D:
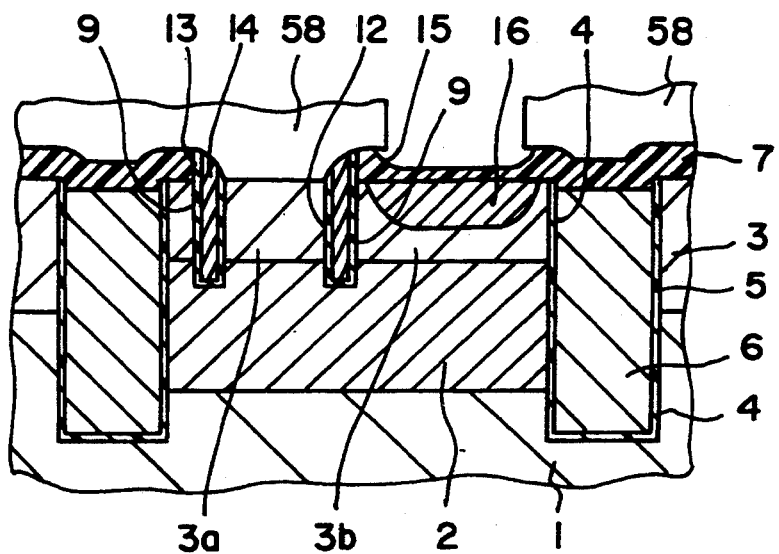
Figure 5E:
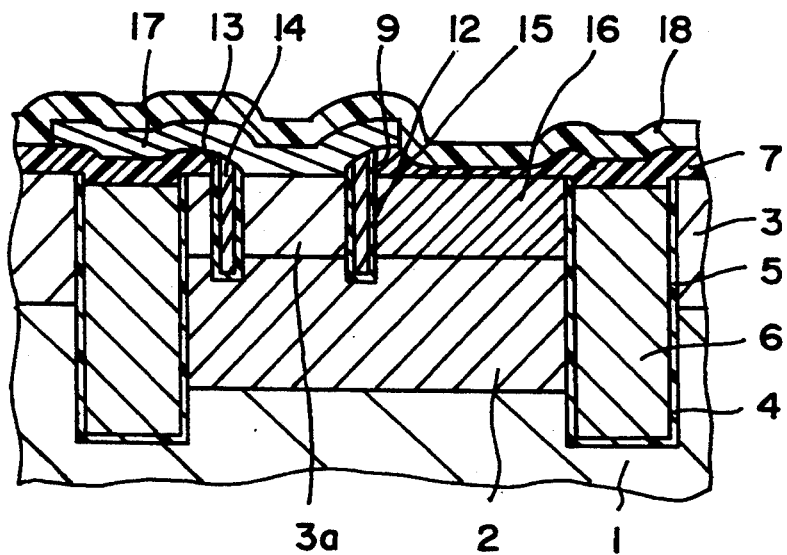
Figure 5F:
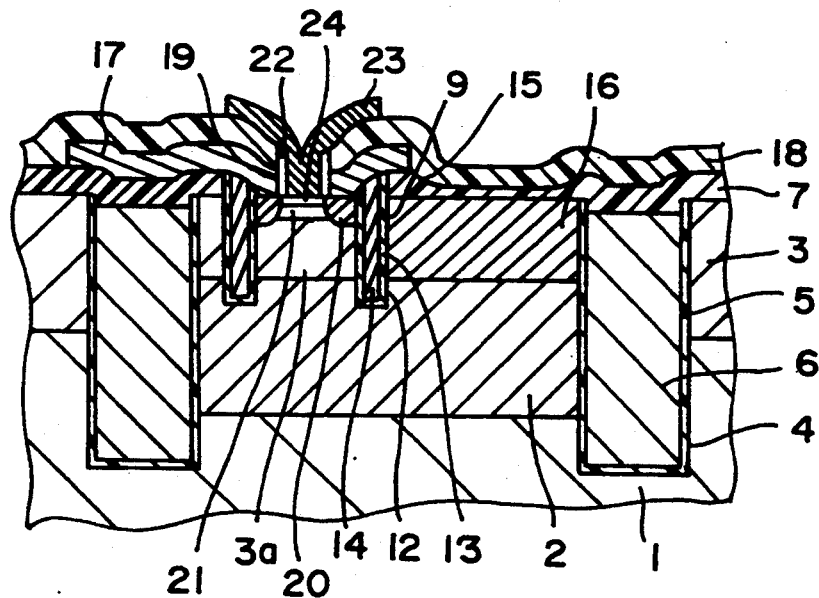

A method for manufacturing the semiconductor device according to the second embodiment will now be described with reference to FIGS. 5A–5F. FIGS. 5A–5C are cross-sectional views arranged in sequential order of steps A–C of a process for manufacturing the semiconductor device (a bipolar type device), and FIGS. 5D–5F show the subsequent steps D–F.

As shown in FIG. 5A, n-type impurities, such as arsenic (As), are selectively introduced into the p-type silicon substrate 1, so that an n-type buried layer 2 is formed to a thickness of about $1 \sim 3$ μm. Subsequently, the n-type epitaxial layer 3 having a thickness of about $0.4 \sim 1$ μm and resistivity of about $0.5 \sim 2$ Q·cm is formed.

As shown in FIG. 5B, the assembly is then subjected to RIE using a not-illustrated photoresist as a mask. The n-type epitaxial layer 3, the n-type buried layer 2 and the p-type silicon substrate 1 are etched, so that a first trench 4 having a width of $0.6 \sim 1.2$ μm is formed.

It is desirable that the depth of the first trench 4 be deeper than the bottom of the n-type buried layer 2 by approximately $0.5 \sim 2$ μm.

The inside of the first trench 4 is filled with a buried substance 6. As to the way for burying the trench 4, there is, for example, a method in which a film having a superior step coverage and a thickness more than the width of the first trench 4, such as BPSG (borophosphosilicate glass) or polysilicon, is formed over the entire surface of the assembly after a silicon dioxide film 5 has been formed inside the first trench 4, and the film is left in only the first trench 4 by etching back.

Instead of the formation of the first trench 4, it is possible to isolate the elements from each other by the p-n isolation method or LOCOS (Local Oxidation of Silicon) isolation method.

After the silicon dioxide film 7 having a thickness of 0.4 μm and a silicon nitride film 8 having a thickness of 0.05 μm have been deposited in that order, the silicon nitride film 8 and the silicon dioxide film 7 are sequentially etched using a not-illustrated photoresist as a mask, thereby forming the opening 9 on the epitaxial layer 3.

Subsequently, the surface of the n-type epitaxial layer 3 is oxidized by the thermal oxidation method, so that a silicon dioxide film 31 having a thickness of $5 \sim 40$ nm is formed.

After a silicon nitride film has been deposited, this silicon nitride film is etched back so that a silicon nitride film 10 is formed along the inner surface of the opening 9.

The surface of the n-type epitaxial layer 3 is oxidized by the thermal oxidation process, so that a silicon dioxide film 11 having a thickness of, for example, 0.1 μm (see step B shown in FIG. 5B) is formed. Here, two layers, that is, a silicon dioxide film having a thickness of, for example, $5 \sim 50$ nm formed by thermal oxidation and a silicon dioxide film formed by the selective liquid phase growth method can be used for the silicon dioxide film 11.

As can be seen from a step C shown in FIG. 5C, both the silicon nitride films 8 and 10 of the step B are etched away by, for example, a heated phosphoric acid solution. The silicon dioxide film 31 is then removed by RIE, whereby the n-type epitaxial layer 3 is uncovered.

The exposed n-type epitaxial layer 3 is etched by RIE, and the second trench 12 is formed to reach the n-type buried layer 2. In this way, the n-type epitaxial layer 3 is divided into sub-divisions 3a and 3b (see the step C shown in FIG. 5C).

The silicon dioxide film 13 having a thickness of, for example, 10 nm is formed, and the buried substance 14 such as a silicon dioxide film and a BPSG film, or the like, having substantially the same thickness as that of the second trench 12 is then formed. The cross-section of the assembly at this time is shown in FIG. 5C.

Thereafter, the buried substance 14 and the silicon dioxide films 13 and 7 are etched back by RIE to a dotted line (corresponding to a surface 32 obtained after the etching back) of the step C shown in FIG. 5C.

As shown in FIG. 5D, a part of the silicon dioxide film 7 surrounded by the opening 9 and the first trench 4 is etched away by diluted hydrofluoric acid in such a way that it is left to a thickness of, for example, 200~500 Angstroms, so that a collector impurity injection part 15 is formed.

N-type impurities such as phosphor (P) are introduced into the n-type epitaxial layer 3b through the remaining silicon dioxide film 7 by ion implantation using a photoresist 58 as a mask, whereby a collector region 16 is formed. The cross-section of the assembly at this time is shown in FIG. 5D.

The assembly is then subjected to a heat treatment after a photoresist 58 has been removed, which causes the dense n-type impurities of the collector section 16 to reach the n-type buried layer 2 as shown in FIG. 5E.

On the other hand, the p+ polysilicon region 17 is formed on the opening 9. This p+ polysilicon region 17 is formed by forming non-doped polysilicon having a thickness of 0.2 $\mu$m by means of, for example, the low pressure chemical vapor deposition (LPCVD) method, and by introducing boron (B) into the non-doped polysilicon at an acceleration energy of 20 keV and a dosage of $10^{-16}$ cm$^{-2}$ by means of ion implantation.

This p+ polysilicon region 17 is patterned in such a way that it is left at an area where a base electrode is to be formed. Then, a silicon dioxide film 18 having a thickness of, for example, 0.2 $\mu$m is formed. The cross-section of the assembly at this time is shown in FIG. 5E.

Next, as shown in FIG. 5F, parts of the silicon dioxide film 18 and the p+ polysilicon region 17 surrounded by the second trench 12 are anisotropically etched using a not-illustrated photoresist as a mask, so that an emitter opening 19 having, for example, a width of 0.6 $\mu$m and a length of 1.2 $\mu$m is formed. Subsequently, an intrinsic base region 21 is formed by introducing boron (B) or BF$_2$ by means of ion implantation.

In the case of introducing boron, ion implantation can be carried out under specific conditions, for example, at 30 keV and a dosage of about $2\sim5\times10^{13}$ cm$^{-2}$.

After an emitter sidewall 22 made of a dielectric film having a thickness of, for example, 0.1 $\mu$m has been formed, an emitter polysilicon region 23 including, for example, arsenic (As) and having a thickness of 20 nm is formed. This is then subjected to, for example, a rapid thermal annealing (RTA) treatment for fifteen seconds at a temperature of 1000° C. or a heat treatment in a furnace for thirty minutes at a temperature of 900° C. Thus, arsenic contained in the emitter polysilicon region 23 is introduced into the intrinsic base region 21, so that an emitter region 24 is formed.

At the same time, boron contained in the polysilicon region 17 is diffused into the n-type epitaxial layer 3, so that the external base region 20 is formed. The cross section of the assembly at this time is shown in FIG. 5F.

Lastly, as shown in FIGS. 4A and 4B, after a silicon dioxide film 44 has been formed, a wiring contact hole 25 is opened in the silicon dioxide films 44 and 18. Then, after aluminum has been deposited over the entire surface of the assembly, it is then patterned to form an aluminum wiring 27, whereby the semiconductor device (a bipolar type device) of the second embodiment is completed.

In the semiconductor device according to the second embodiment, where the width of the second trench 12 is narrow, a degree of integration is increased, but a parasitic capacitance associated to the second trench 12 is also increased. Conversely, where the width of the second trench 12 is wide, the parasitic capacitance decreases, but a degree of integration also decreases.

For these reasons, it is possible to appropriately adjust the width of the second trench 12 depending on applications of the semiconductor device. As the width of the second trench, 0.05~0.4 $\mu$m is preferable.

It is desirable for the second trench 12 to have such a depth that its bottom reaches a vicinity of or an upper part of the n-type buried layer 2. Here, the depth of the second trench 12 may be made shallow unless the high concentration n-type impurities in the collector section 16 adversely affect the performance of the transistor.

Although an n-p-n type bipolar transistor is shown in the second embodiment, it is possible to manufacture a p-n-p type transistor by changing the conductivity types of impurities.

Moreover, in the semiconductor device according to the second embodiment, it should be noted that the opening 9, the second trench 12 and the external base region 20 are formed by the use of the same photoresist.

Thus, the external base region 20 is formed only at an area where it comes into contact with the intrinsic base region 21 that is necessary for a base, and the second trench 12 is situated along the outer periphery of the external base region 20 (see the step B shown in FIG. 4B).

Figure 6A:
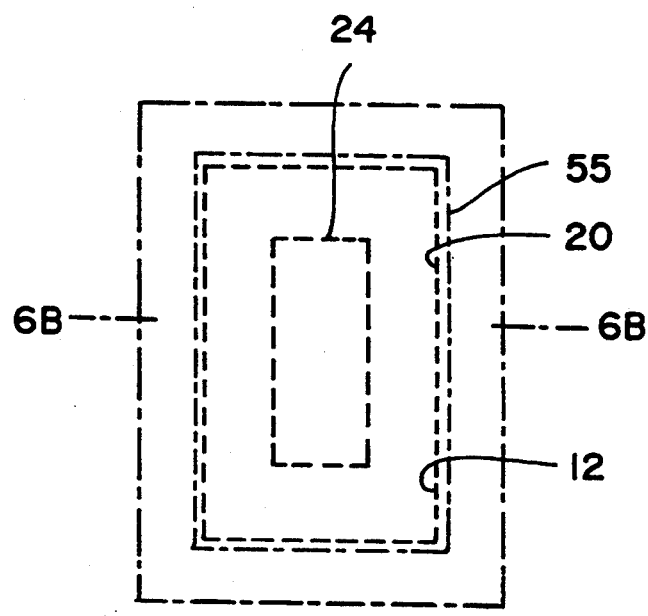
Figure 6B:
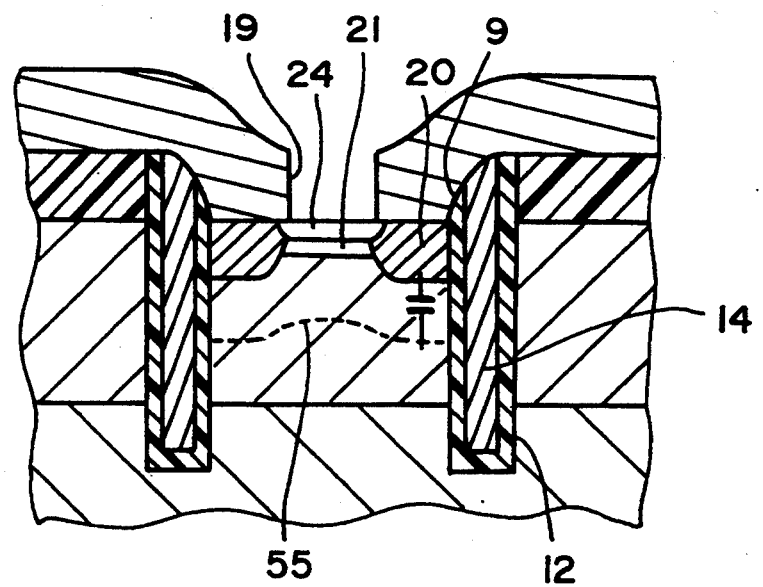

Now, with reference to FIGS. 6A, 6B and 7A, 7B, an effect of the semiconductor device of the present invention including the first and second embodiments will be described. FIG. 6A is a plan view showing the semiconductor device of the present invention, and FIG. 6B is a cross-sectional view taken along a line 6B—6B shown in FIG. 6A. In FIGS. 6A and 6B, reference numeral 55 denotes an area of depletion layer.

Figure 7A:
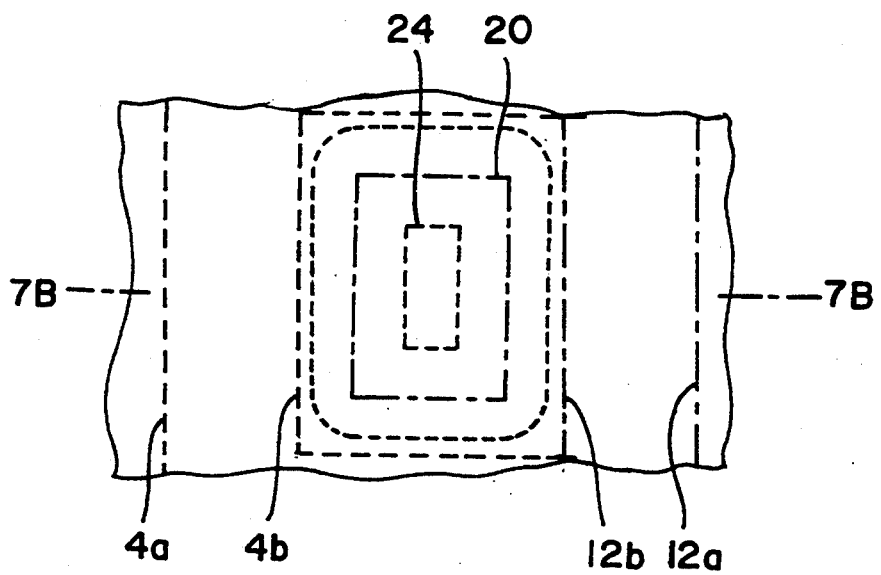
Figure 7B:
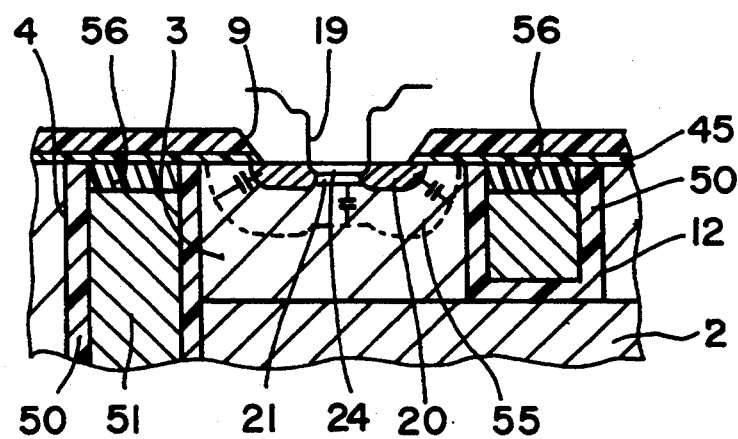

FIGS. 7A is a plan view showing a conventional semiconductor device which corresponds to that shown in FIG. 6A, and FIG. 7B is a cross-sectional view taken along a line 7B—7B in FIG. 7A. In FIGS. 6A, 6B and 7A, 7B, the same reference numerals are provided to designate corresponding elements of FIGS. 1A-1G, 2, 3A, 3B, 4A, 4B and 5A-5F, and hence the explanation thereof will be omitted here for brevity.

In the conventional semiconductor device, as shown in FIGS. 7A and 7B, a junction capacitance also appears on the second trench 12 side of the external base region 20. Contrary to this, the parasitic capacitance does not appear on the second trench 12 side as shown in FIGS. 6A and 6B.

As is evident from the foregoing comparison, there is obtained an effect in which a junction capacitance between a base and a collector in the semiconductor device of the present invention is reduced when compared to a junction capacitance between a base and a collector in the conventional semiconductor device.

For instance, assume that the size of an emitter opening 19 is set to 0.6 $\mu$m $\times$ 1.4 $\mu$m and the width of a depletion layer of the junction capacitance is set to 0.3 $\mu$m for both of the semiconductor devices according to the present invention and the prior art. Also, assume that a distance between the emitter opening 19 and the second trench 12 of the semiconductor device according to the present invention is set to 0.3 μm, whereas a distance between the emitter opening 19 and the opening 9 of the conventional semiconductor device is set to 0.3 μm.

In the semiconductor device of the present invention, if a distance between the opening 9 and the second trench 12 is set to 0.6 μm, the junction capacitance between a base and a collector of the semiconductor device according to the present invention decreases to not more than half that obtained from the conventional semiconductor device.

Figure 8A:
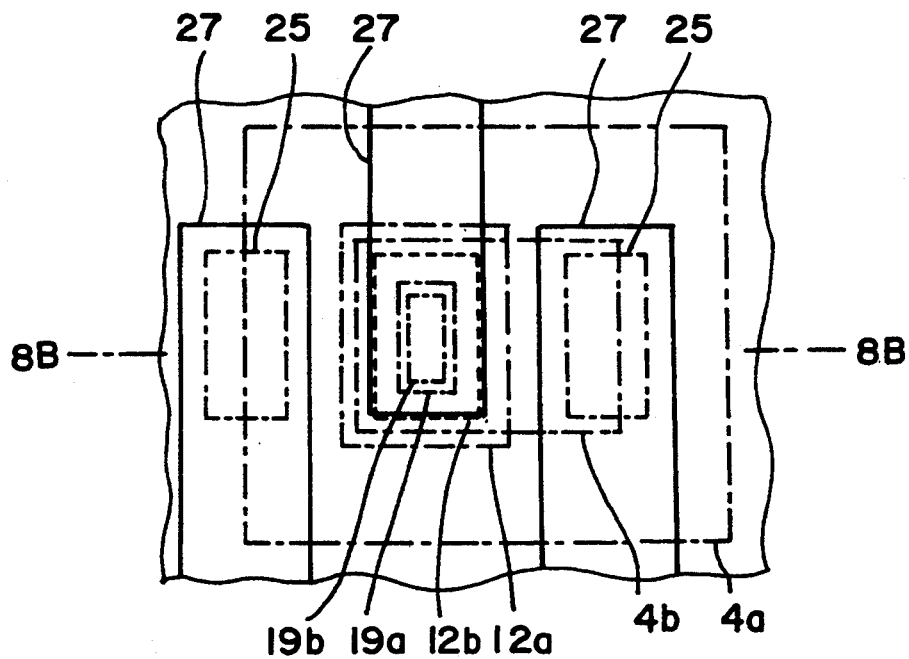
Figure 8B:
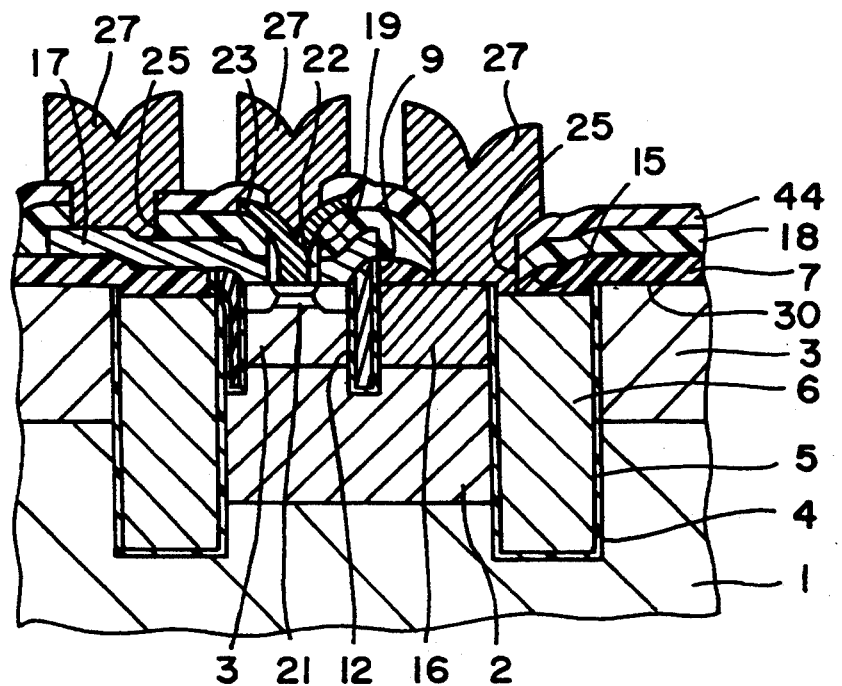

FIGS. 8A and 8B illustrate a semiconductor device according to a third embodiment of the present invention. FIG. 8A is a plan view of the semiconductor device, and FIG. 8B is a cross-sectional view taken along a line 8B—8B shown in FIG. 8A. In FIGS. 8A and 8B, the same reference numerals are provided to designate corresponding elements of FIGS. 3A–5F, and the explanation thereof will be omitted here for brevity. In FIG. 8A, reference numerals 4a and 4b denote an outer and an inner periphery of the first trench 4, respectively; reference numerals 12a and 12b denote an outer and an inner periphery of the second trench 12, respectively; and reference numerals 19a and 19b denote an outer and an inner periphery of the emitter sidewall 22, respectively.

The semiconductor device of the third embodiment has a structure as shown in FIGS. 8A and 8B, in which a part of the first trench 4 overlaps along three sides of the second trench 12.

A method for manufacturing the semiconductor device according to the third embodiment is the same as that used in the second embodiment, except that mask patterns of the lithography masks are changed.

The semiconductor device of the third embodiment has the n-type buried layer 2 and the n-type epitaxial layer 3 which are smaller than those of the semiconductor device of the second embodiment. The semiconductor device of this embodiment is also advantageous in that it has a small parasitic capacitance and enables an improvement in the degree of integration.

Figure 9A:
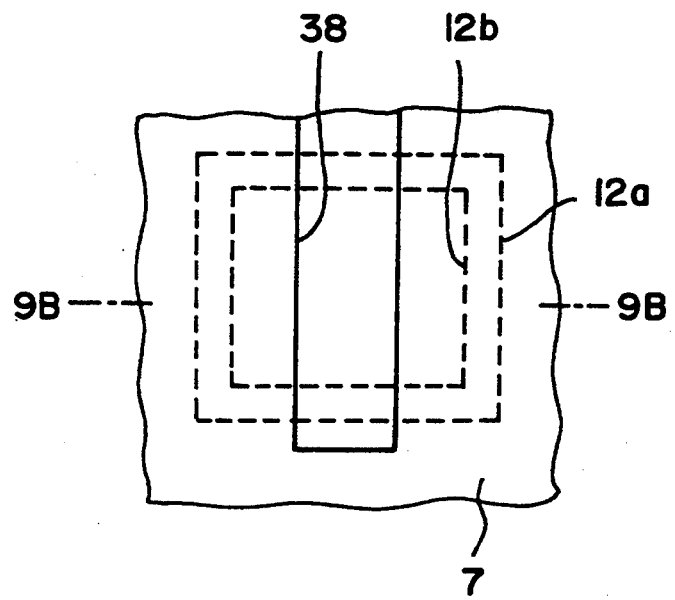
Figure 9B:
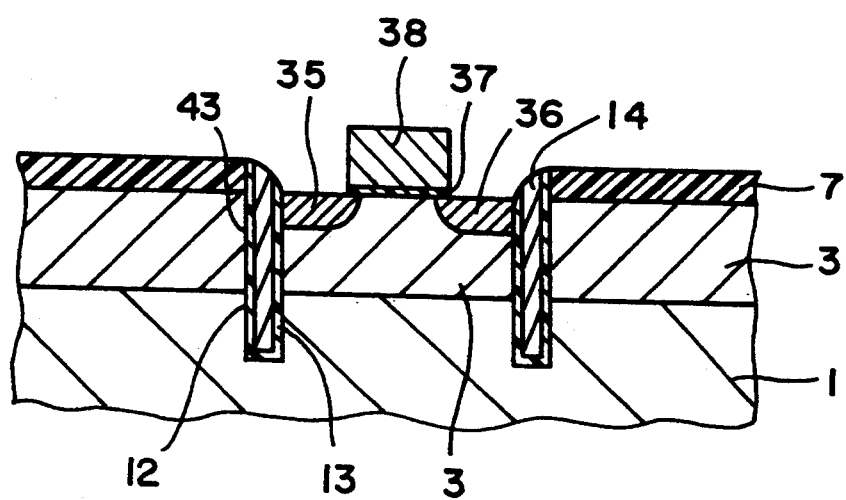

FIGS. 9A and 9B illustrate a semiconductor device according to a fourth embodiment of the present invention. FIG. 9A is a plan view of the semiconductor device, and FIG. 9B is a cross-sectional view taken along a line 9B—9B shown in FIG. 9A. In FIGS. 9A and 9B, the same reference numerals are provided to designate the corresponding elements of FIGS. 3A–5F, and the explanation thereof will be omitted here for brevity. In FIG. 9A, reference numerals 12a and 12b denote an outer and an inner periphery of the second trench 12, respectively.

The semiconductor device of the fourth embodiment has a structure as shown in FIGS. 9A and 9B, in which the n-type epitaxial layer 3 around a MOS type transistor is separated by the second trench 12.

A method for manufacturing the semiconductor device of the fourth embodiment will now be described. Similar steps to those in the second embodiment are taken up until the point at which the second trench 12 is filled (see the steps A–C shown in FIGS. 5A–5C).

Following the step C shown in FIG. 5C, the buried substance 14 and the silicon dioxide film 7 are etched back to the dotted line of the step C shown in FIG. 5C (corresponding to the surface 32 obtained after the etching back) by RIE. Then, a gate film 37 is formed by thermal oxidation in the manner as shown in FIG. 9B.

After polysilicon has been deposited on the assembly, it is patterned to form a gate electrode 38 on the gate film 37. Subsequently, a source region 35 and a drain region 36 are formed by introducing p-type impurities using the gate electrode 38 as a mask, whereby a semiconductor device (MOS type transistor) of the fourth embodiment shown in FIGS. 9A and 9B is completed.

The semiconductor device of the fourth embodiment has the effect of decreasing a parasitic capacitance between a silicon substrate 1 and a drain electrode 36, a parasitic capacitance between the silicon substrate 1 and a source electrode 35 and a parasitic capacitance between other adjacent elements.

Figure 10A:
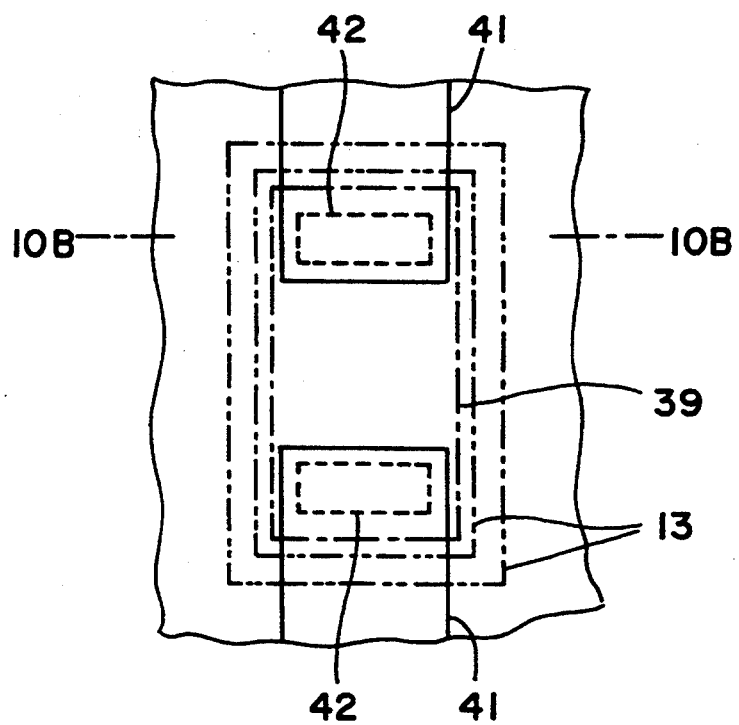
Figure 10B:
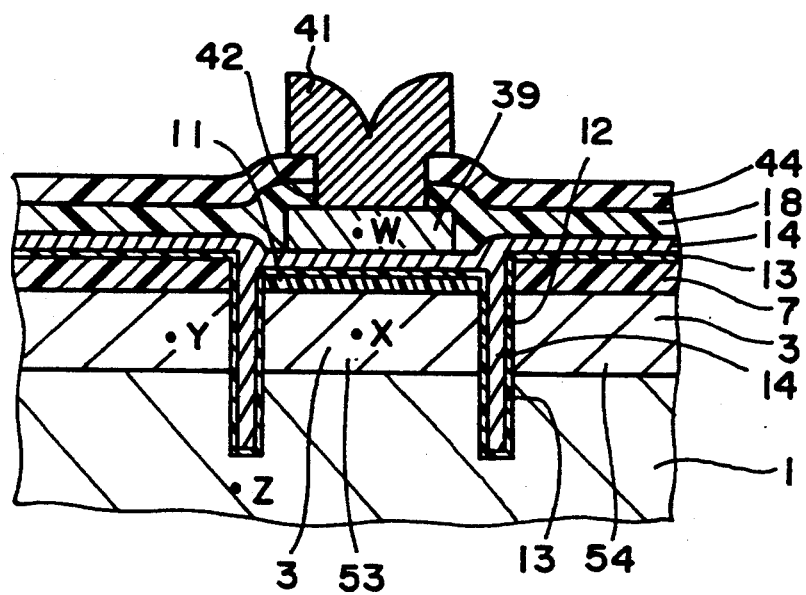

FIGS. 10A and 10B illustrate a semiconductor device according to a fifth embodiment of the present invention. FIG. 10A is a plan view of the semiconductor device, and FIG. 10B is a cross-sectional view taken along a line 10B—10B shown in FIG. 10A. In FIGS. 10A and 10B, the same reference numerals are provided to designate the corresponding elements of FIGS. 3A–5F, and the explanation thereof will be omitted here for brevity.

As shown in FIGS. 10A and 10B, the feature of the semiconductor device of the fifth embodiment is the provision of a resistive polysilicon layer 39 formed above the silicon dioxide film 13 over the n-type epitaxial layer 3. The feature of this embodiment further resides in that the n-type epitaxial layer 3 is dielectrically separated by the second trench 12 into a portion below the resistive polysilicon layer 39 (i.e., an n-type epitaxial layer 53 below the resistance element) and the other portions (i.e., an n-type epitaxial layer 54 other than the n-type epitaxial layer 53 below the resistive element).

Figure 11A:
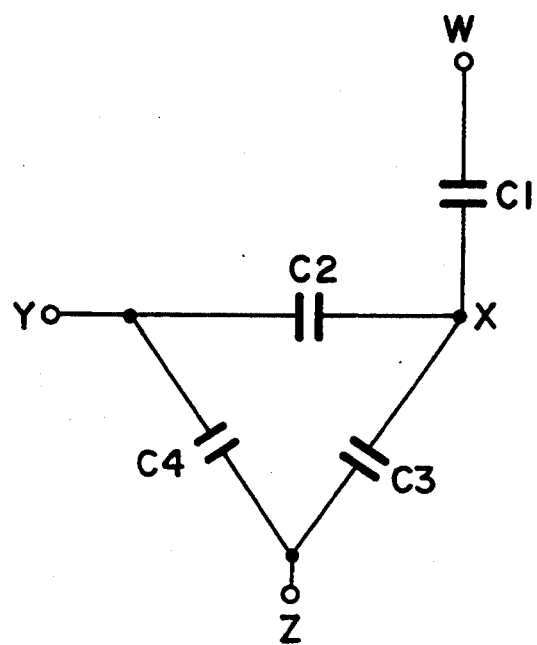
Figure 11B:
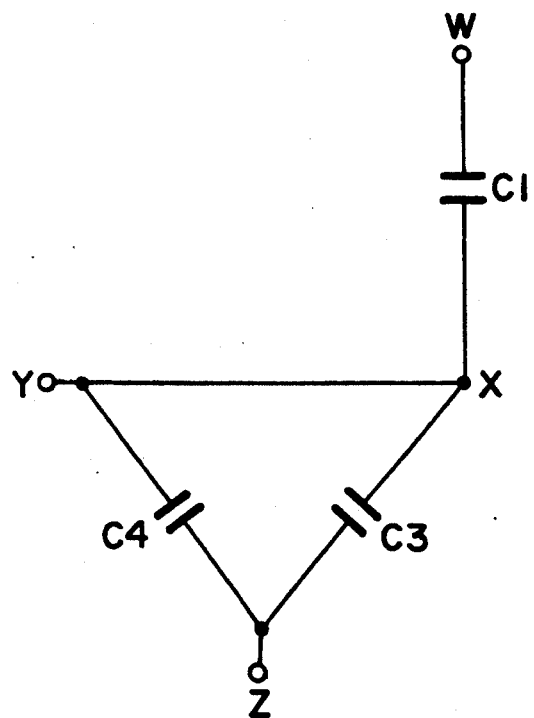

With reference to FIGS. 11A and 11B, an effect of the semiconductor device of the fifth embodiment will now be described.

FIGS. 11A and 11B illustrate an effect of the semiconductor device of the fifth embodiment. Specifically, FIG. 11A shows parasitic capacitances between points W–Z shown in FIG. 10B, and FIG. 11B shows a parasitic capacitance when the semiconductor device of the fifth embodiment is not provided with the second trench 12.

In FIGS. 11A and 11B, C1 designates a capacitance between points W and X with a dielectric film interposed between them; C2 designates a capacitance between points X and Y obtained through the second trench 12; C3 designates a p-n junction capacitance between points X and Z; and C4 designates a p-n junction capacitance between points Z and Y (see FIG. 10B).

A parasitic capacitance between the resistive polysilicon 39 and the p-type silicon substrate 1 is the sum of the parasitic capacitance C1 between the points W and X and the parasitic capacitance C3 between the points X and Z connected in series (see FIG. 10B).

When the semiconductor device is provided with the second trench 12 (i.e., in the case of the semiconductor device of the fifth embodiment), the total parasitic capacitance between the points X and Z is given by:

$$C3+(C2^{-1}+C4^{-1})^{-1}.$$

Contrary to this, when the semiconductor device is not provided with the second trench 12, the total capacitance is given by:

$$C3+C4.$$

Since $(C_2^{-1}+C_4^{-1})^{-1} < C_4$, it is possible for the semiconductor device of the fifth embodiment to reduce the parasitic capacitance owing to the provision of the second trench 12.

As described above, the second trench of the semiconductor device of the present invention is formed in a self-aligned manner along the outer periphery of the external base region. Moreover, a semiconductor region having a p-n junction can be formed in a self-aligned manner while it is in contact with the second trench. For this reason, a junction capacitance of the semiconductor device of the present invention is not more than half that of a conventional semiconductor device, and hence a high speed performance of the element can be advantageously achieved.

The present invention makes it possible to form a trench having a width which is considerably narrower than a minimum processing size of lithography, that is, a width between 0.05~0.4 μm.

Therefore, according to the present invention, it is possible to reduce the size of an element and a parasitic capacitance.

Several embodiments of the invention have now been described in detail. It is to be noted, however, that these descriptions of specific embodiments are merely illustrative of the principles underlying the inventive concept. It is contemplated that various modifications of the disclosed embodiments, as well as other embodiments of the invention will, without departing from the spirit and scope of the invention, be apparent to those who are versed in the art.

What is claimed is:

1. A method for manufacturing a semiconductor device comprising the steps of:
    (a) forming a first insulation film on a main surface of a semiconductor substrate, said first insulating film serving as an element isolation film;
    (b) forming an opening in said first insulation film by etching said first insulation film using a photoresist as a mask;
    (c) forming an annular film along an inner sidewall of said opening with an upper surface of said semiconductor substrate exposed therein;
    (d) forming a second insulation film on the exposed surface of said semiconductor substrate surrounded by said annular film;
    (e) etching away said annular film to cause the surface of said semiconductor substrate to be exposed annularly;
    (f) etching an annularly exposed portion of said semiconductor substrate to form an annular trench; and
    (g) forming a film layer containing at least a third insulation film over the entire main surface of said semiconductor substrate including the inside of said annular trench.

2. A method for manufacturing a semiconductor device as defined in claim 1, wherein the semiconductor substrate is formed by a silicon substrate as a lower layer, a buried layer and an epitaxial layer as an upper layer, said buried layer being sandwiched between said silicon substrate and said epitaxial layer; said first insulation film is formed by a silicon dioxide film; said annular film is formed by a silicon nitride film; said second insulation film is formed by a silicon dioxide film; and said third insulation film contained in said film layer is formed by a silicon dioxide film.

3. A method for manufacturing a semiconductor device as defined in claim 2, wherein said annular trench is formed so as to reach an upper surface area of said buried layer of said semiconductor substrate.

4. A method for manufacturing a semiconductor device comprising the steps of:
    forming an element isolation trench in a semiconductor substrate by using a photoresist as a mask;
    forming a first insulation film on a main surface of said semiconductor substrate;
    forming an opening in said first insulation film by etching said first insulation film using a photoresist as a mask;
    forming an annular film along an inner sidewall of said opening with an upper surface of said semiconductor substrate exposed therein;
    forming a second insulation film on the exposed surface of said semiconductor substrate surrounded by said annular film;
    etching away said annular film to cause the surface of said semiconductor substrate to be exposed annularly;
    etching an annularly exposed portion of said semiconductor substrate to form an annular trench; and
    forming a film layer containing at least a third insulation film over the entire main surface of said semiconductor substrate including the inside of said annular trench, wherein said element isolation trench is formed deeper than said annular trench and filled with an insulation film and a buried substance.

5. A method for manufacturing a semiconductor device as defined in claim 4, further comprising the steps of:
    etching said first insulation film surrounded by said opening and said element isolation trench to form a collector injection part;
    introducing impurities into said epitaxial layer below said collector impurity injection part by ion implantation to form a collector region;
    subjecting the assembly thus formed to a heat treatment to cause said impurities in said collector region to diffuse into said buried layer;
    depositing polysilicon over said opening with impurities being injected, to form a base polysilicon portion;
    forming a silicon dioxide film over the entire assembly;
    anisotropically etching said silicon dioxide film and said base polysilicon portion to form an emitter opening;
    introducing impurities into said semiconductor substrate through said emitter opening to form an intrinsic base region;
    forming an emitter sidewall and then an emitter polysilicon portion;
    subjecting the assembly to a heat treatment to form an emitter region and simultaneously introducing impurities contained in said base polysilicon portion to said epitaxial layer to form an external base region;
    forming a silicon dioxide film and then a wiring contact hole in said silicon dioxide films; and
    forming an aluminum wiring by patterning after aluminum has been deposited over the entire surface of the assembly.

6. A method for manufacturing a semiconductor device as defined in claim 4, wherein mask patterns of said photoresist used in lithography are selectively changed so that said annular trench overlaps along three sides of said element isolation trench.

7. A method for manufacturing a semiconductor device comprising the steps of:
- forming a first insulation film on a main surface of a semiconductor substrate;
- forming an opening in said first insulation film by etching said first insulation film using a photoresist as a mask:
- forming an annular film along an inner sidewall of said opening with an upper surface of said semiconductor substrate exposed therein;
- forming a second insulation film on the exposed surface of said semiconductor substrate surrounded by said annular film;
- etching away said annular film to cause the surface of said semiconductor substrate to be exposed annularly;
- etching an annularly exposed portion of said semiconductor substrate to form an annular trench;
- forming a film layer containing at least a third insulation film over the entire main surface of said semiconductor substrate including the inside of said annular trench; and
- forming a resistive polysilicon portion on said film layer laid on said semiconductor substrate, so that said semiconductor substrate is dielectrically separated into a first portion located below said resistive polysilicon and a second portion other than said first portion.

* * * * *